(12) United States Patent
Lin

(10) Patent No.: US 8,383,324 B2
(45) Date of Patent: Feb. 26, 2013

(54) MASK REGISTRATION CORRECTION

(75) Inventor: Cheng-Ming Lin, Yunlin County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1421 days.

(21) Appl. No.: 11/779,741

(22) Filed: Jul. 18, 2007

(65) Prior Publication Data

US 2009/0023099 A1    Jan. 22, 2009

(51) Int. Cl.
G03F 7/20 (2006.01)
(52) U.S. Cl. ............ 430/311; 430/394; 430/22
(58) Field of Classification Search ......... 430/5, 30, 430/22, 311, 394, 312
See application file for complete search history.

(56) References Cited

U.S. PATENT DOCUMENTS

| 5,044,750 | A  | * | 9/1991  | Shamble       | 356/625 |
| 6,630,408 | B1 | * | 10/2003 | Tzu et al.    | 438/717 |
| 7,037,626 | B2 | * | 5/2006  | Dirksen et al.| 430/5   |

* cited by examiner

*Primary Examiner* — Kathleen Duda
*Assistant Examiner* — Caleen Sullivan
(74) *Attorney, Agent, or Firm* — Haynes and Boone, LLP

(57) ABSTRACT

A method of manufacturing a semiconductor device comprising forming an active region in a device substrate using a first phase shift mask (PSM) having a first patterned light shielding layer formed thereon, forming a polysilicon feature on the device substrate over the active region using a second PSM having a second patterned light shielding layer formed thereon, forming a contact feature on the polysilicon feature using a third PSM having a third patterned light shielding layer formed thereon, and forming a metal feature on the contact feature using a fourth PSM having a fourth patterned light shielding layer formed thereon, wherein at least one of the third and fourth patterned light shielding layers is patterned substantially similarly to at least one of the first and second patterned light shielding layers.

20 Claims, 6 Drawing Sheets

MASK REGISTRATION CORRECTION

CROSS-REFERENCE TO RELATED APPLICATION

This application is related to commonly-assigned U.S. patent application Ser. No. 11/688,141 to Cheng-Ming Lin, et al., filed Mar. 19, 2007, entitled "Method and System for Improving Critical Dimension Proximity Control of Patterns on a Mask or Wafer," the disclosure of which is hereby incorporated by reference.

BACKGROUND

According to the International Technology Roadmap for Semiconductors (ITRS), image placement requirements for optical masks was 7 nm for node N65. However, current optical mask registration for node N65 is as much as 18 nm, or more than twice the predicted requirement. Moreover, for node N45, the optical mask registration requirement is predicted to decrease to 4.8 nm, although achievable registration is predicted to only be as small as 15 nm. Similarly, for node N32, the optical mask registration requirement is predicted to decrease to 3.4 nm, although achievable registration is predicted to only be as small as 12 nm.

One possible factor in the existing and predicted inability to achieve sufficiently accurate optical mask registration is the impact of stress in the mask blank. For example, even where the blank stress is low by current standards, the contact overlay to poly is near 16 nm, which is significantly greater than the predicted requirements for optical mask registration. Moreover, differences in pattern Cr loading (or density) between different masks employed during different phases of manufacture can result in different stress distributions of each mask, which can further adversely affect mask registration.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
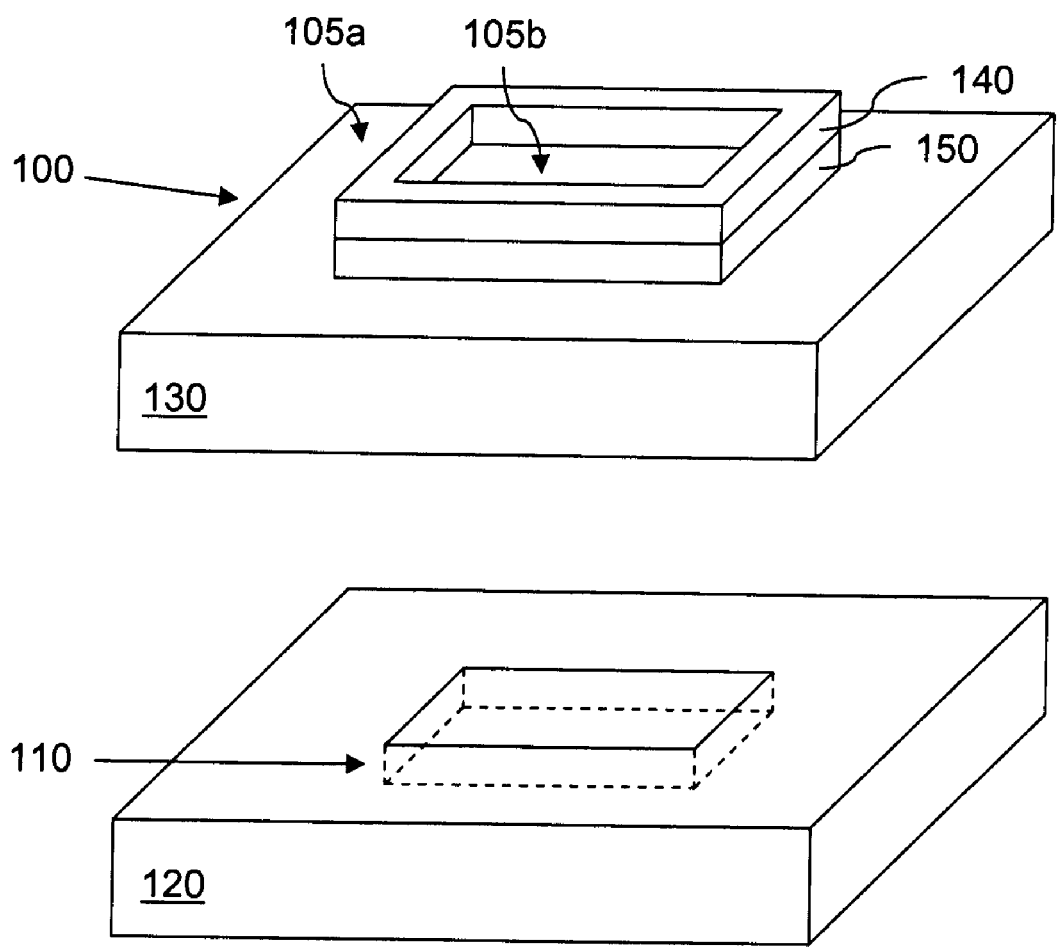
FIG. 1 is a perspective view of an optical mask for forming an active region according to one or more aspects of the prior art.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a perspective view of a phase shift mask (PSM) 100 configured for forming an active region 110 in a substrate 120 according to one or more aspects of the prior art. Photomasks such as the PSM 100 are used in a broad range of applications, including the manufacture of semiconductor integrated circuits. The PSM mask 100 comprises a light-transmissive substrate 130 and a desired pattern of light shielding film 140 of chromium or the like formed thereon. A phase shift layer 150 is also patterned on the substrate 130, and may interpose the substrate 130 and the light shielding film 140, as shown in FIG. 1. The PSM 100 has both exposed substrate areas (first light-transmitting areas) 105a on which there is no phase shift film, and phase shifters (second light-transmitting areas) 105b that form a pattern region on the PSM 100.

For practical purposes, the PSM 100 can be broadly categorized, according to the light-transmitting characteristics of the phase shift layer 150, as either a completely transmitting PSM or a halftone PSM. Completely transmitting phase shift masks are masks in which the phase shift layer 150 has the same light transmittance as the substrate 130, and which are thus transparent to light of the exposure wavelength. In halftone phase shift masks, the phase shift layer 150 has a light transmittance that ranges from about several percent to several tens of percent of the transmittance of the substrate 130.

The halftone phase shift masks proposed thus far are halftone phase shift masks of the single-layer type which are simple in structure. Single-layer halftone phase shift masks known to the art have a phase shift layer 150 comprising molybdenum, such as those composed of molybdenum silicide (MoSi), molybdenum silicide oxide (MoSiO) or molybdenum silicide oxynitride (MoSiON).

Such phase shift masks are manufactured by lithographically patterning phase shift mask blanks. The lithography involves the step of applying a resist onto a phase shift mask blank, irradiating selected portions of the resist with electron beams or ultraviolet radiation, developing the resist, and etching desired portions of the phase shift film. Thereafter, the resist film is stripped, leaving a phase shift mask.

In a photomask blank like the phase shift mask blank discussed above, a film like the phase shift film is generally formed on a substrate by sputtering. Stresses may be induced in the film, by which the substrate may be distorted. The resulting photomask blank may thus be warped. If a photomask is manufactured through patterning of such a photomask blank, the warpage of the substrate may be locally resumed to the original state prior to film formation because the film is partially removed by patterning. The resulting substrate may have varying degrees of flatness. These changes may introduce positional shifts between the mask blank during the pattern exposure and the actually finished mask. Such positional shifts may have a larger influence as the mask pattern becomes finer, and the warpage may cause focal shifts.

Figure 2:
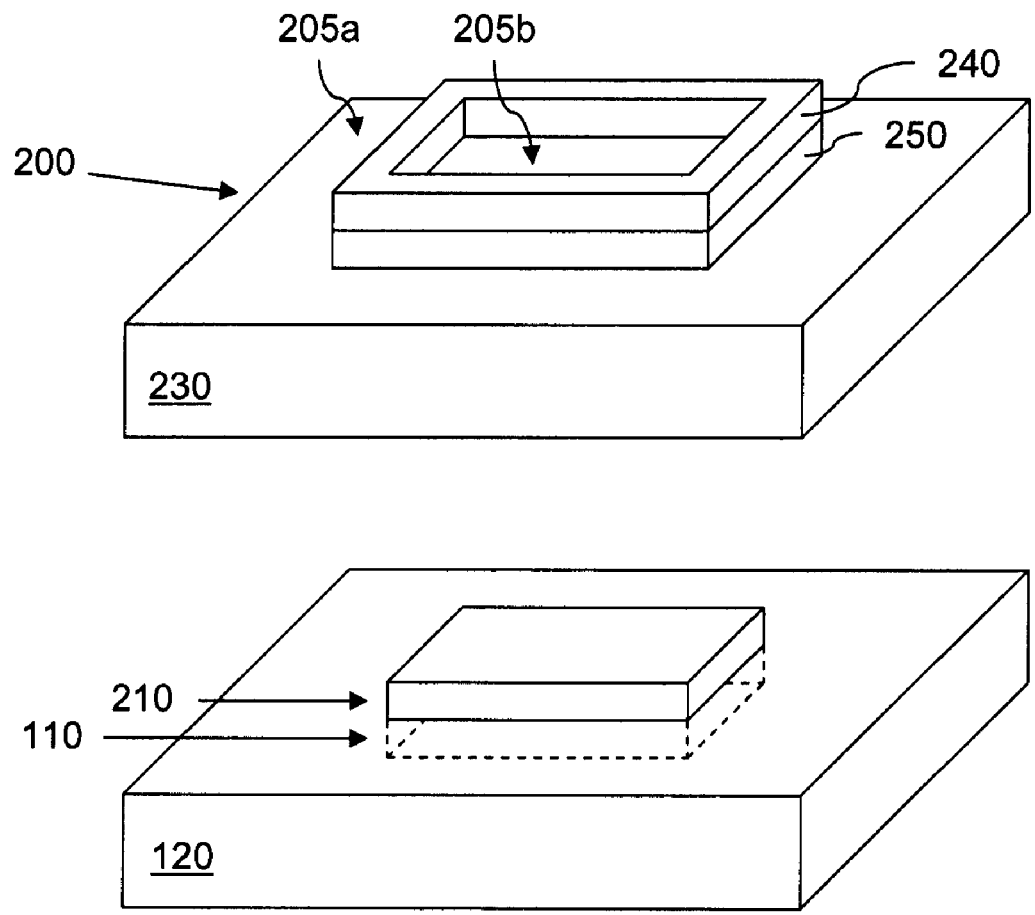
FIG. 2 is a perspective view of an optical mask for forming a poly layer according to one or more aspects of the prior art.

Referring to FIG. 2, illustrated is a perspective view of another PSM 200 configured for forming a polysilicon ("poly") region 210 on the substrate 120 according to one or more aspects of the prior art. The PSM mask 200 comprises a light-transmissive substrate 230 and a desired pattern of light shielding film 240 of chromium or the like formed thereon. A phase shift layer 250 is also patterned on the substrate 230, and may interpose the substrate 230 and the light shielding film 240, as shown in FIG. 2. The PSM 200 has both exposed substrate areas (first light-transmitting areas) 205a on which there is no phase shift film 250, and phase shifters (second light-transmitting areas) 205b that form a pattern region on the PSM 200.

The phase shift layer 250 and the light shielding layer 240 are substantially similar or identical in composition and manufacture relative to the phase shift layer 150 and the light shielding layer 140 shown in FIG. 1. Moreover, the pattern loading of the light shielding layer 240 is substantially similar to the pattern loading of the light shielding layer 140 shown in FIG. 1. Consequently, any distortion or warpage caused by the formation of the light shielding layer 240 on the substrate 230 will be substantially similar to the distortion or warpage caused by the formation of the light shielding layer 140 on the substrate 130. Therefore, any resulting registration error of the PSM 200 will be the same as the corresponding registration error of the PSM 100. Consequently, image placement or mask registration of the PSM 200 can be substantially the same as that for the PSM 100.

Figure 3:
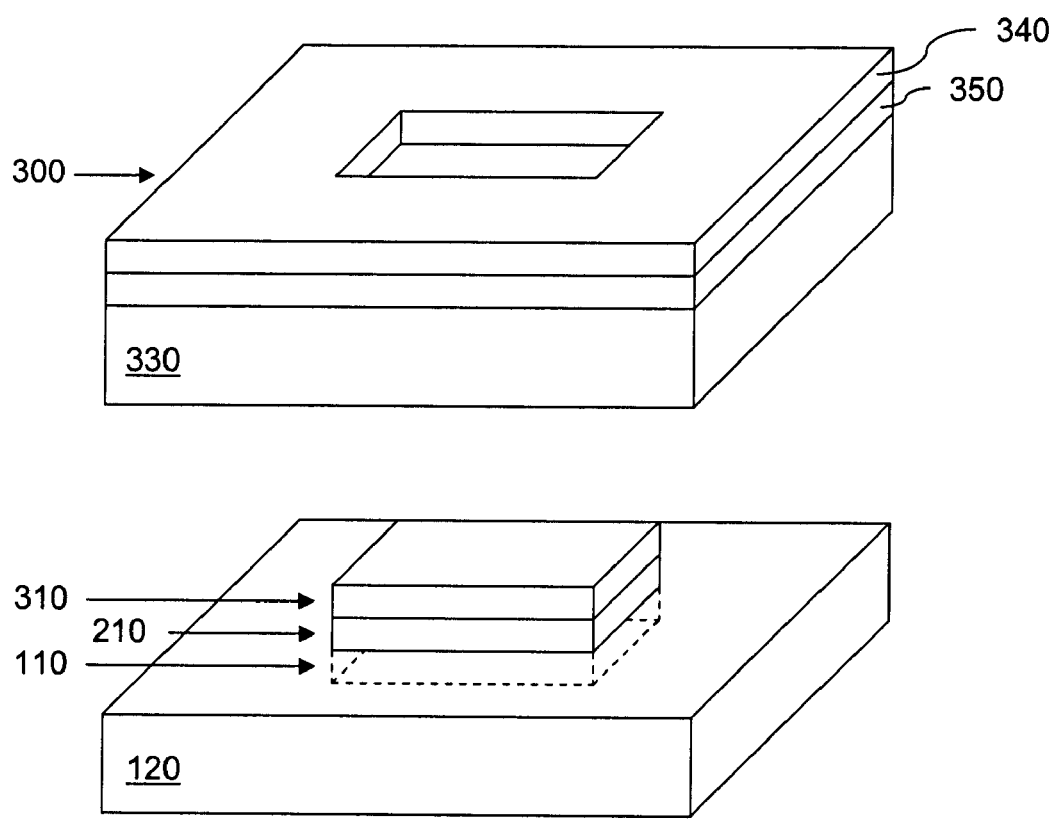
FIG. 3 is a perspective view of an optical mask for forming a contact layer according to one or more aspects of the prior art.

Referring to FIG. 3, illustrated is a perspective view of another PSM 300 configured for forming a contact feature 310 on the substrate 120 according to one or more aspects of the prior art. The PSM mask 300 comprises a light-transmissive substrate 330 and a desired pattern of light shielding film 340 of chromium or the like formed thereon. A phase shift layer 350 is also patterned on the substrate 330, and may interpose the substrate 330 and the light shielding film 340, as shown in FIG. 3.

The phase shift layer 350 and the light shielding layer 340 are substantially similar or identical in composition and manufacture relative to the phase shift layer 150 and the light shielding layer 140 shown in FIG. 1. However, the pattern loading of the light shielding layer 340 is substantially greater than the pattern loading of the light shielding layer 140 shown in FIG. 1. Consequently, any distortion or warpage caused by the formation of the light shielding layer 340 on the substrate 330 may be substantially greater or otherwise different relative to the distortion or warpage caused by the formation of the light shielding layer 140 on the substrate 130. Therefore, any resulting registration error of the PSM 300 will be the greater or otherwise different relative to the corresponding registration error of the PSM 100. Consequently, image placement or mask registration of the PSM 300 can be substantially different relative to the image placement or mask registration for the PSM 100.

Figure 4:
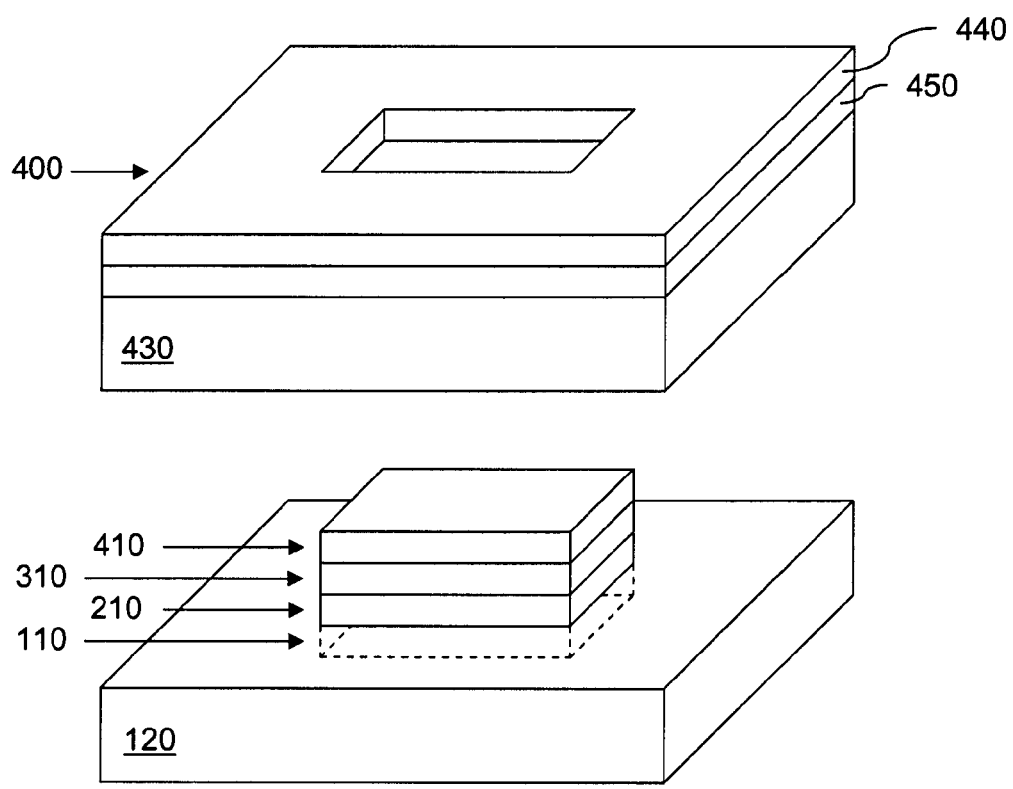
FIG. 4 is a perspective view of an optical mask for forming a first metal (M1) layer according to one or more aspects of the prior art.

Referring to FIG. 4, illustrated is a perspective view of another PSM 400 configured for forming a contact or other metal feature 410 on the substrate 120 according to one or more aspects of the prior art. The metal feature 410 may be that which is conventionally formed in a Metal-1 ("M1") layer over or on the contact 310 shown in FIG. 3. The PSM mask 400 comprises a light-transmissive substrate 430 and a desired pattern of light shielding film 440 of chromium or the like formed thereon. A phase shift layer 450 is also patterned on the substrate 430, and may interpose the substrate 430 and the light shielding film 440, as shown in FIG. 4.

The phase shift layer 450 and the light shielding layer 440 are substantially similar or identical in composition and manufacture relative to the phase shift layer 150 and the light shielding layer 140 shown in FIG. 1. Moreover, the pattern loading of the light shielding layer 440 is substantially similar to the pattern loading of the light shielding layer 340 shown in FIG. 3. Consequently, any distortion or warpage caused by the formation of the light shielding layer 440 on the substrate 430 will be substantially similar to the distortion or warpage caused by the formation of the light shielding layer 340 on the substrate 330. Therefore, any resulting registration error of the PSM 400 will be the same as the corresponding registration error of the PSM 300. Consequently, image placement or mask registration of the PSM 400 can be substantially the same as that for the PSM 300.

However, the pattern loading of the light shielding layer 440 is substantially greater than the pattern loading of the light shielding layer 140 shown in FIG. 1 and the light shielding layer 240 shown in FIG. 2. Consequently, any distortion or warpage caused by the formation of the light shielding layer 440 on the substrate 430 may be substantially greater or otherwise different relative to the distortion or warpage caused by the formation of the light shielding layer 140 on the substrate 130 and/or the light shielding layer 240 on the substrate 230. Therefore, any resulting registration error of the PSM 400 will be the greater or otherwise different relative to the corresponding registration error of the PSM 100 and/or the corresponding registration error of the PSM 200. Consequently, image placement or mask registration of the PSM 400 can be substantially different relative to the image placement or mask registration for the PSM 100 and/or for the PSM 200.

Figure 5:
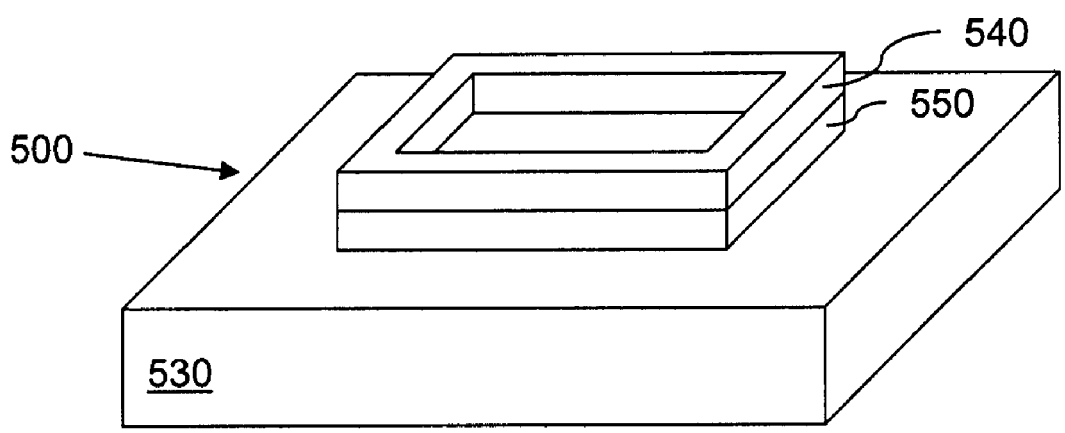
FIG. 5 is a perspective view of an optical mask for forming a contact layer according to one or more aspects of the present disclosure.
Figure 5:
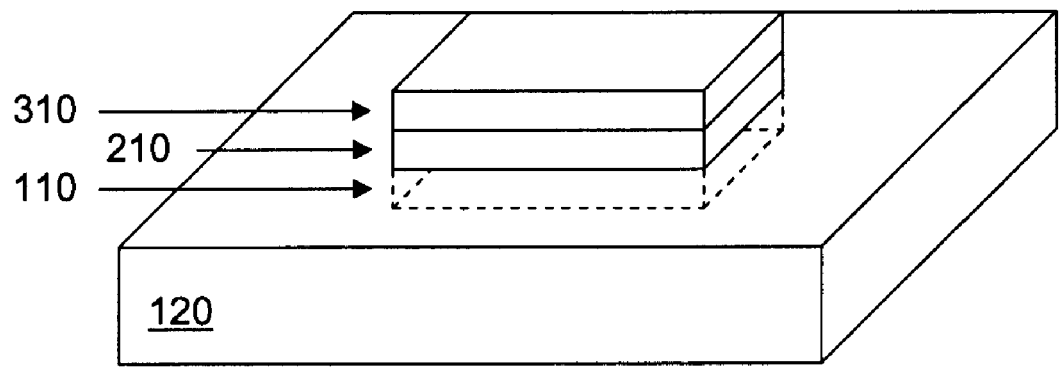

Referring to FIG. 5, illustrated is a perspective view of another PSM 500 configured for forming a contact feature 310 on the substrate 120 according to one or more aspects of the present disclosure. The PSM mask 500 comprises a light-transmissive substrate 530 and a desired pattern of light shielding film 540 of chromium or the like formed thereon. A phase shift layer 550 is also patterned on the substrate 530, and may interpose the substrate 530 and the light shielding film 540, as shown in FIG. 5.

The phase shift layer 550 and the light shielding layer 540 are substantially similar or identical in composition and manufacture relative to the phase shift layer 150 and the light shielding layer 140 shown in FIG. 1. However, the pattern loading of the light shielding layer 340 is substantially similar or identical to the pattern loading of the light shielding layer 140 shown in FIG. 1 and the pattern loading of the light shielding layer 240 shown in FIG. 2. Consequently, any distortion or warpage caused by the formation of the light shielding layer 540 on the substrate 530 may be substantially similar or identical to the distortion or warpage caused by the formation of the light shielding layer 140 on the substrate 130 and/or the distortion or warpage caused by the formation of the light shielding layer 240 on the substrate 230. Therefore, any resulting registration error of the PSM 500 will be substantially similar or identical to the corresponding registration error of the PSM 100 and/or the PSM 200. Consequently, image placement or mask registration of the PSM 500 can be substantially similar or identical to the image placement or mask registration for the PSM 100 and/or the PSM 300.

Figure 6:
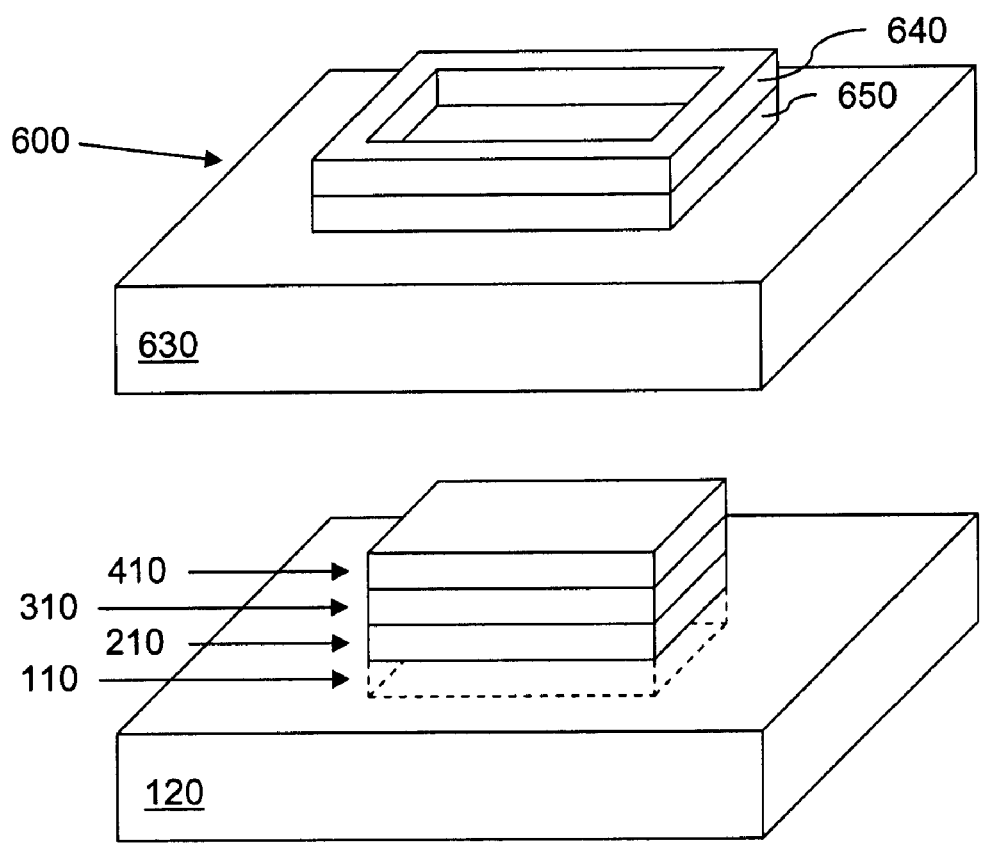
FIG. 6 is a perspective view of an optical mask for forming an M1 layer according to one or more aspects of the present disclosure.

Referring to FIG. 6, illustrated is a perspective view of another PSM 600 configured for forming a contact or other metal feature 410 on the substrate 120 according to one or more aspects of the present disclosure. The metal feature 610 may be that which is conventionally formed in a Metal-1 ("M1") layer over or on the contact 510 shown in FIG. 5. The PSM mask 600 comprises a light-transmissive substrate 630 and a desired pattern of light shielding film 640 of chromium or the like formed thereon. A phase shift layer 650 is also patterned on the substrate 630, and may interpose the substrate 630 and the light shielding film 640, as shown in FIG. 6.

The phase shift layer 650 and the light shielding layer 640 are substantially similar or identical in composition and manufacture relative to the phase shift layer 150 and the light shielding layer 140 shown in FIG. 1. Moreover, the pattern loading of the light shielding layer 640 is substantially similar to the pattern loading of the light shielding layer 540 shown in FIG. 5. Consequently, any distortion or warpage caused by the formation of the light shielding layer 640 on the substrate 630 will be substantially similar or identical to the distortion or warpage caused by the formation of the light shielding layer 540 on the substrate 530. Therefore, any resulting registration error of the PSM 600 will be substantially similar or identical to the corresponding registration error of the PSM 500. Consequently, image placement or mask registration of the PSM 600 can be substantially similar or identical to that for the PSM 500.

Moreover, the pattern loading of the light shielding layer 640 is substantially similar or identical to the pattern loading of the light shielding layer 140 shown in FIG. 1 and the light shielding layer 240 shown in FIG. 2. Consequently, any distortion or warpage caused by the formation of the light shielding layer 640 on the substrate 630 may be substantially similar or identical to the distortion or warpage caused by the formation of the light shielding layer 140 on the substrate 130 and/or the formation of the light shielding layer 240 on the substrate 230. Therefore, any resulting registration error of the PSM 600 will be substantially similar or identical to the corresponding registration error of the PSM 100 and/or the corresponding registration error of the PSM 200. Consequently, image placement or mask registration of the PSM 600 can be substantially similar or identical to the image placement or mask registration for the PSM 100 and/or for the PSM 200.

Experimentation conducted by the Inventor yielded unexpected results of conforming the Cr loading or density of the light shielding layer 540 shown in FIG. 5 and/or the light shielding layer 640 shown in FIG. 6 to the Cr loading or density of the light shielding layer 140 shown in FIG. 1 and/or the light shielding layer 240 shown in FIG. 2 according to one or more aspects of the present disclosure. That is, the experimentation unexpectedly revealed that such conformity of the Cr loading of the light shielding layers of the different PSMs improves run-out by about 40%. Consequently, mask registration according to one or more aspects of the present disclosure can be improved to beyond Node 32 nm technology. For example, mask registration can be improved to below 10 nm. However, other measures and levels of improvement are also within the scope of the present disclosure.

In an exemplary embodiment, a method according to the above-described aspects and otherwise within the scope of the present disclosure includes forming a plurality of first features in a substrate using at least a first one of a plurality of phase shift masks, forming a plurality of layers over the substrate, and forming a plurality of second features from corresponding ones of the plurality of layers using second ones of the plurality of phase shift masks, wherein all of the plurality of phase shift masks, including the first one and the second ones and any others of the plurality of phase shift masks used to manufacture the semiconductor device, have substantially the same pattern loading at outer areas thereof.

Thus, for example, all of the masks utilized to manufacture a single product may have identical or similar pattern loading, at least at an outer region thereof, such as near the perimeter of each mask, according to one or more aspects described herein. In an exemplary embodiment, all of the plurality of phase shift masks, including the first one and the second ones and any others of the plurality of phase shift masks used to manufacture the semiconductor device, have patterned light shielding layers that are patterned substantially the same at the outer areas thereof.

In view of the above, it should be apparent to those skilled in the pertinent art that the present disclosure introduces a method of manufacturing a semiconductor device comprising forming an active region in a device substrate using a first phase shift mask (PSM) having a first patterned light shielding layer formed thereon, forming a polysilicon feature on the device substrate over the active region using a second PSM having a second patterned light shielding layer formed thereon, forming a contact feature on the polysilicon feature using a third PSM having a third patterned light shielding layer formed thereon, and forming a metal feature on the contact feature using a fourth PSM having a fourth patterned light shielding layer formed thereon, wherein at least one of the third and fourth patterned light shielding layers is patterned substantially similarly to at least one of the first and second patterned light shielding layers. Each one of the third and fourth patterned light shielding layers may be patterned substantially similarly to each of the first and second patterned light shielding layers. Each of the first, second, third and fourth patterned light shielding layers may be composed of chromium. Each of the first, second, third and fourth PSMs may further comprise a molybdenum-containing layer interposing the corresponding one of the first, second, third and fourth patterned light shielding layers and a corresponding PSM substrate. The molybdenum-containing layer may be composed of molybdenum silicide (MoSi), molybdenum silicide oxide (MoSiO), or molybdenum silicide oxynitride (MoSiON). The method may further comprise positioning the first PSM relative to the device substrate and thereby obtaining a first overlay amount, positioning the second PSM relative to the device substrate and thereby obtaining a second overlay amount, positioning the third PSM relative to the device substrate and thereby obtaining a third overlay amount, and positioning the fourth PSM relative to the device substrate and thereby obtaining a fourth overlay amount, wherein at least one of the first and second overlay amounts may be substantially equal in magnitude to at least one of the third and fourth overlay amounts. Each of the first and second overlay amounts may be substantially equal in magnitude to each of the third and fourth overlay amounts. At least one of the first and second overlay amounts may be substantially equal in magnitude and direction to at least one of the third and fourth overlay amounts. Each of the first and second overlay amounts may be substantially equal in magnitude and direction to each of the third and fourth overlay amounts.

The present disclosure also introduces a method of manufacturing a semiconductor device comprising forming an active region in a device substrate using a first phase shift mask (PSM) having a first patterned light shielding layer formed thereon, forming a polysilicon feature on the device substrate over the active region using a second PSM having a second patterned light shielding layer formed thereon, forming a contact feature on the polysilicon feature using a third PSM having a third patterned light shielding layer formed thereon, and forming a metal feature on the contact feature using a fourth PSM having a fourth patterned light shielding layer formed thereon, wherein at least one of the first and second patterned light shielding layers and at least one of the third and fourth patterned light shielding layers have substantially the same pattern loading. Each of the first, second, third and fourth patterned light shielding layers may have substantially the same pattern loading. Each of the first, second, third and fourth patterned light shielding layers may be composed of chromium. Each of the first, second, third and fourth PSMs may further comprise a molybdenum-containing layer interposing the corresponding one of the first, second, third and fourth patterned light shielding layers and a corresponding PSM substrate. The molybdenum-containing layer may be composed of a material selected from the group consisting of: molybdenum silicide (MoSi), molybdenum silicide oxide (MoSiO), and molybdenum silicide oxynitride (MoSiON). The method may further comprise positioning the first PSM relative to the device substrate and thereby obtaining a first overlay amount, positioning the second PSM relative to the device substrate and thereby obtaining a second overlay amount, positioning the third PSM relative to the device substrate and thereby obtaining a third overlay amount, and positioning the fourth PSM relative to the device substrate and thereby obtaining a fourth overlay amount, wherein at least one of the first and second overlay amounts may be substantially equal in magnitude to at least one of the third and fourth overlay amounts. Each of the first and second overlay amounts may be substantially equal in magnitude to each of the third and fourth overlay amounts. At least one of the first and second overlay amounts may be substantially equal in magnitude and direction to at least one of the third and fourth overlay amounts. Each of the first and second overlay amounts may be substantially equal in magnitude and direction to each of the third and fourth overlay amounts.

The present disclosure also provides a method of manufacturing a semiconductor device comprising forming a plurality of first features in a substrate using at least a first one of a plurality of phase shift masks, forming a plurality of layers over the substrate, and forming a plurality of second features from corresponding ones of the plurality of layers using second ones of the plurality of phase shift masks, wherein all of the plurality of phase shift masks, including the first one and the second ones and any others of the plurality of phase shift masks used to manufacture the semiconductor device, have substantially the same pattern loading at outer areas thereof. In an exemplary embodiment, all of the plurality of phase shift masks, including the first one and the second ones and any others of the plurality of phase shift masks used to manufacture the semiconductor device, have patterned light shielding layers that are patterned substantially the same at the outer areas thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a semiconductor device, comprising:
    forming a plurality of first features in a substrate using at least a first one of a plurality of phase shift masks;
    forming a plurality of layers over the substrate; and
    forming a plurality of second features in the layers from corresponding ones of the plurality of layers using second ones of the plurality of phase shift masks;
    wherein all of the plurality of phase shift masks, including the first one and the second ones and any others of the plurality of phase shift masks used to manufacture the semiconductor device, have substantially the same pattern loading at outer areas of the phase shift masks.

2. The method of claim 1 wherein all of the plurality of phase shift masks, including the first one and the second ones and any others of the plurality of phase shift masks used to manufacture the semiconductor device, have patterned light shielding layers that are patterned substantially the same at the outer areas of the phase shift masks.

3. A method of manufacturing a semiconductor device, comprising:
    forming an active region in a device substrate using a first phase shift mask (PSM) having a first patterned light shielding layer formed thereon;
    forming a polysilicon feature on the device substrate over the active region using a second PSM having a second patterned light shielding layer formed thereon;
    forming a contact feature on the polysilicon feature using a third PSM having a third patterned light shielding layer formed thereon; and
    forming a metal feature on the contact feature using a fourth PSM having a fourth patterned light shielding layer formed thereon;
    wherein at least one of the third and fourth patterned light shielding layers is patterned substantially similarly to at least one of the first and second patterned light shielding layers.

4. The method of claim 3 wherein each one of the third and fourth patterned light shielding layers is patterned substantially similarly to each of the first and second patterned light shielding layers.

5. The method of claim 3 wherein each of the first, second, third and fourth patterned light shielding layers is composed of chromium.

6. The method of claim 5 wherein each of the first, second, third and fourth PSMs further comprise a molybdenum-containing layer interposing the corresponding one of the first, second, third and fourth patterned light shielding layers and a corresponding PSM substrate.

7. The method of claim 6 wherein the molybdenum-containing layer is composed of a material selected from the group consisting of: molybdenum silicide (MoSi), molybdenum silicide oxide (MoSiO), and molybdenum silicide oxynitride (MoSiON).

8. The method of claim 3 further comprising:
    positioning the first PSM relative to the device substrate and thereby obtaining a first overlay amount;
    positioning the second PSM relative to the device substrate and thereby obtaining a second overlay amount;
    positioning the third PSM relative to the device substrate and thereby obtaining a third overlay amount; and
    positioning the fourth PSM relative to the device substrate and thereby obtaining a fourth overlay amount;
    wherein at least one of the first and second overlay amounts is substantially equal in magnitude to at least one of the third and fourth overlay amounts.

9. The method of claim 8 wherein each of the first and second overlay amounts is substantially equal in magnitude to each of the third and fourth overlay amounts.

10. The method of claim 8 wherein at least one of the first and second overlay amounts is substantially equal in magnitude and direction to at least one of the third and fourth overlay amounts.

11. The method of claim 8 wherein each of the first and second overlay amounts is substantially equal in magnitude and direction to each of the third and fourth overlay amounts.

12. A method of manufacturing a semiconductor device, comprising:
forming an active region in a device substrate using a first phase shift mask (PSM) having a first patterned light shielding layer formed thereon;
forming a polysilicon feature on the device substrate over the active region using a second PSM having a second patterned light shielding layer formed thereon;
forming a contact feature on the polysilicon feature using a third PSM having a third patterned light shielding layer formed thereon; and
forming a metal feature on the contact feature using a fourth PSM having a fourth patterned light shielding layer formed thereon;
wherein at least one of the first and second patterned light shielding layers and at least one of the third and fourth patterned light shielding layers have substantially the same pattern loading.

13. The method of claim 12 wherein each of the first, second, third and fourth patterned light shielding layers have substantially the same pattern loading.

14. The method of claim 13 wherein each of the first, second, third and fourth patterned light shielding layers is composed of chromium.

15. The method of claim 14 wherein each of the first, second, third and fourth PSMs further comprise a molybdenum-containing layer interposing the corresponding one of the first, second, third and fourth patterned light shielding layers and a corresponding PSM substrate.

16. The method of claim 15 wherein the molybdenum-containing layer is composed of a material selected from the group consisting of: molybdenum silicide (MoSi), molybdenum silicide oxide (MoSiO), and molybdenum silicide oxynitride (MoSiON).

17. The method of claim 12 further comprising:
positioning the first PSM relative to the device substrate and thereby obtaining a first overlay amount;
positioning the second PSM relative to the device substrate and thereby obtaining a second overlay amount;
positioning the third PSM relative to the device substrate and thereby obtaining a third overlay amount; and
positioning the fourth PSM relative to the device substrate and thereby obtaining a fourth overlay amount;
wherein at least one of the first and second overlay amounts is substantially equal in magnitude to at least one of the third and fourth overlay amounts.

18. The method of claim 17 wherein each of the first and second overlay amounts is substantially equal in magnitude to each of the third and fourth overlay amounts.

19. The method of claim 17 wherein at least one of the first and second overlay amounts is substantially equal in magnitude and direction to at least one of the third and fourth overlay amounts.

20. The method of claim 17 wherein each of the first and second overlay amounts is substantially equal in magnitude and direction to each of the third and fourth overlay amounts.

* * * * *